(12) United States Patent
Bohnert et al.

(10) Patent No.: US 10,877,076 B2
(45) Date of Patent: Dec. 29, 2020

(54) FIBER-OPTIC CURRENT SENSOR WITH TOLERANCE TO CONNECTOR MISALIGNMENT

(71) Applicant: ABB Power Grids Switzerland AG, Baden (CH)

(72) Inventors: Klaus Bohnert, Oberrohrdorf (CH); Philippe Gabus, Nyon (CH)

(73) Assignee: ABB Power Grids Switzerland AG, Baden (CH)

( * ) Notice: Subject to any disclaimer, the term of this patent is extended or adjusted under 35 U.S.C. 154(b) by 154 days.

(21) Appl. No.: 15/953,876

(22) Filed: Apr. 16, 2018

(65) Prior Publication Data

US 2018/0238934 A1    Aug. 23, 2018

Related U.S. Application Data

(63) Continuation of application No. PCT/EP2016/072933, filed on Sep. 27, 2016.

(30) Foreign Application Priority Data

Oct. 14, 2015  (EP) ..................................... 15189760

(51) Int. Cl.
*G01R 15/24* (2006.01)
*G01R 19/00* (2006.01)

(52) U.S. Cl.
CPC ......... *G01R 15/247* (2013.01); *G01R 15/246* (2013.01); *G01R 19/0092* (2013.01)

(58) Field of Classification Search
CPC . G01R 15/241; G01R 15/247; G01R 19/0092
(Continued)

(56) References Cited

U.S. PATENT DOCUMENTS 5,953,121 A * 9/1999 Bohnert ............... G01R 15/246
                                                    250/227.19
6,244,753 B1 * 6/2001 O'Connor ................. G01J 3/44
                                                    385/12
(Continued)

FOREIGN PATENT DOCUMENTS

CN      1175693 A    3/1998
CN    102135554 A    7/2011
(Continued)

OTHER PUBLICATIONS

European Patent Office, International Search Report & Written Opinion issued in corresponding Application No. PCT/EP2016/072933, dated Dec. 23, 2016, 17 pp.
(Continued)

*Primary Examiner* — Christopher E Mahoney
(74) *Attorney, Agent, or Firm* — Sage Patent Group (57) ABSTRACT

A fiber-optic current sensor includes an opto-electronics module, a sensor head and a connecting fiber connecting the opto-electronics module to the sensor head. The sensor includes a first and a second beam splitter, between which the measuring light runs in two branches. One fiber connector is arranged in each branch, for connecting a cable assembly to the opto-electronics module. The optical path lengths between the two connectors and the second beam splitter are different, such that light waves cross-coupled into an orthogonal polarization mode due to angular misalignment of the connectors become incoherent with the non-cross-coupled waves returning from the sensor head.

22 Claims, 7 Drawing Sheets

(58) Field of Classification Search
USPC .......................................................... 324/95

See application file for complete search history.

(56) References Cited

U.S. PATENT DOCUMENTS

| | | | |
|---|---|---|---|
| 6,281,672 B1 | 8/2001 | Terai et al. | |
| 8,320,719 B2 * | 11/2012 | Wueest | G01R 3/00 |
| | | | 324/95 |
| 8,836,950 B2 | 9/2014 | Sasaki et al. | |
| 9,310,399 B2 * | 4/2016 | Bohnert | G01R 15/246 |
| 9,417,267 B2 | 8/2016 | Dorner et al. | |
| 2002/0006244 A1 | 1/2002 | Bohnert | |
| 2012/0121216 A1 | 5/2012 | Oh | |
| 2017/0234912 A1 * | 8/2017 | Yao | G01R 15/246 |
| | | | 324/96 |

FOREIGN PATENT DOCUMENTS

| | | |
|---|---|---|
| CN | 203786180 U | 8/2014 |
| DE | 4224190 A1 | 1/1994 |
| EP | 2629102 A2 | 8/2013 |
| GB | 2239102 A | 6/1991 |
| WO | 2011069558 A1 | 6/2011 |

OTHER PUBLICATIONS

European Patent Office, Extended Search Report issued in corresponding Application No. 15189760.0, dated Apr. 25, 2016, 11 pp.

K. Bohnert et al., "Temperature and Vibration Insensitive Fiber-Optic Current Sensor," Journal of Lightwave Technology, vol. 20, No. 2, Feb. 2002, 10 pages.

K. Bohnert et al., "Fiber-Optic Current Sensor for Electrowinning of Metals," Journal of Lightwave Technology, vol. 25, No. 11, Nov. 2007, 8 pages.

H. Lefevre, "The Fiber-Optic Gyroscope," Boston, MA: Artech House, 2nd Edition, 2014, 489 pages.

Chinese Second Office Action dated Aug. 14, 2020 for Chinese Patent Application No. 201680073345.7, 8 pages (including English translation).

Sun, Shenghe et al., "Optical Fiber Measurement and Sensing Technology," Published Jan. 31, 2000 by Harbin Institute of Technology Press, 282 pages (including English translation of relevant p. 200).

* cited by examiner

Returning waves with polarization along x

Returning waves with polarization along y

FIBER-OPTIC CURRENT SENSOR WITH TOLERANCE TO CONNECTOR MISALIGNMENT

TECHNICAL FIELD

The invention relates to fiber-optic current sensors, in particular for current measurements in high voltage substations for electric power transmission and industrial applications.

BACKGROUND ART

Fiber-optic current sensors (FOCS) commonly exploit the Faraday effect in a coil of fused silica sensing fiber, which encloses the current conductor. A large variety of sensor schemes has been investigated in the past. A frequently employed sensor configuration is known from Refs. [1, 2]. Here, two linearly polarized light waves travel from an opto-electronic module through a polarization-maintaining (PM) connecting fiber to the sensing fiber coil, which is operated in reflection mode. A quarter-wave retarder at the coil entrance converts the waves to left and right circular waves. The circular waves accumulate a differential magneto-opto phase shift proportional to the current during their round-trip through the coil. The waves then return to the opto-electronic module, again as orthogonal linearly polarized light waves, but with swapped polarization directions compared to the forward propagating waves. The magneto-optic phase shift is measured based on a detection scheme known from fiber gyroscopes [3]. The scheme involves a modulation of the differential phase of the two light waves, ideally at a frequency corresponding to twice the roundtrip time of the light waves. The magneto-optic phase shift is then derived from the various harmonics of the modulation frequency in the detector signal. Both, open-loop and closed loop detection circuits are known. In [1, 2], the phase modulator is a birefringence modulator, which directly modulates the differential phase of the orthogonal waves. A modified scheme is known from Refs. [4, 5]. Here, the two linearly polarized light waves initially propagate in two separate fiber branches before they are combined to orthogonal waves in a polarization maintaining fiber coupler. A modulator in one or in both fiber branches modulates the phase of the individual linearly polarized waves.

WO 2011/069 558 A1 [6] discloses a method on how to individually calibrate the opto-electronics module and the head of such sensors in order to allow an exchange of either component in the field without the need of subsequent sensor recalibration. WO 2011/069 558 A1 also discloses for this purpose a PM fiber connector along the fiber carrying the orthogonal polarization modes.

The opto-electronics module of fiber-optic current sensors of the above type is connected to the sensor head (which in HV substations typically is on high voltage potential) by a polarization-maintaining (PM) fiber cable. In order to facilitate the sensor installation or the replacement of the opto-electronics module, e.g. at the end of its life, it is desirable to have fiber connectors at one or both ends of the fiber cable. However, the connectors must not reduce the sensor accuracy. Particularly, for electricity metering application, an accuracy to within <±0.2% must be maintained over extended temperature ranges. The electro-winning industry even requires <±0.1% for some measurements. In order to maintain such high accuracy, the polarization cross-talk between the two orthogonal light waves at the connector must be below −33 dB, preferably even below −36 dB. In comparison, commercially available PM connectors typically are specified with a crosstalk between −20 dB and −25 dB. Such connectors are unsuited for use in FOCS with metering accuracy. Typically, the crosstalk changes with temperature as a result of varying mechanical fiber stress in the connector ferrules. A change in polarization cross-coupling, for example from −25 dB to −23 dB, would already result in a scale factor change of about 0.4%. (For comparison, a change from −35 dB to −33 dB alters the scale factor only by about 0.04%).

Cross-coupling at the fiber connector between the orthogonal polarization modes of the fiber generates secondary light waves. In the sensing fiber coil, the secondary waves and their parent waves experience a magneto-optic phase shift of opposite sign. In prior art the secondary waves interfere with their parent waves and due to their opposite phase shift can significantly influence the sensor signal.

DISCLOSURE OF THE INVENTION

The problem to be solved by the present invention is therefore to provide a fiber-optic current sensor as described above that has a connector for connecting the polarization maintaining connecting fiber to the opto-electronics module, but that is reliable, even if the connector is opened and closed repetitively or is subject to other events that might change its cross-coupling behavior.

This problem is solved by the fiber-optic current sensor of claim 1.

Accordingly, the fiber-optic current sensor comprises:

A light source generating light with a coherence length Lc,

A first beam splitter splitting the light from the light source into a first and a second branch, A second beam splitter combining the light from said first and second branches, A polarization maintaining connecting fiber adapted to carry light in first and second, mutually orthogonal polarization modes and receiving light from said second beam splitter for a first passage through said connecting fiber, A sensor head adapted and structured to receive light waves from said first and said second polarization modes of said connecting fiber, to generate a current-dependent phase shift between said light waves, and to reflect said light waves back into said connecting fiber with switched polarizations for a second passage through said connecting fiber. In this context the expression "switched polarizations" states that the wave that was received from the first polarization mode of the connecting fiber is reflected back from the sensor head into the second polarization mode of the connecting fiber, and the wave that was received from the second polarization mode of the connecting fiber is reflected back from the sensor head into the first polarization mode of the connecting fiber;

A detector located to detect the light intensity resulting from an interference of said waves after their second passage through said connecting fiber. Since the phase shift of the light waves and thus the resulting light intensity depends on the current, the detector is able to measure the current.

The sensor further comprises two connectors:

A first releasable connector is arranged in said first branch, and

A second releasable connector is arranged in said second branch.

In this context, "releasable connector" designates a connector that can repeatedly be released (opened) and reconnected (closed).

This design e.g. allows to vary the optical paths in the system and thereby to generate path differences between the various branches and between cross-coupled and non-cross-coupled light waves in order to minimize undesired interferences. Alternatively, or in addition thereto, it allows to enclose each connector on both sides in polarizers, thereby blocking any cross-coupled light waves.

In embodiments, the first branch is advantageously adapted to carry light in a first and a second polarization mode between said first connector and a "select one" of said first and second beam splitters, and the second branch is adapted to carry light in a first and a second polarization mode between said second connector and said select beam splitter, with the term "select beam splitter" designating one of the beam splitters (see further below for a more detailed explanation). When the connectors are perfectly aligned, i.e. there is no angular misalignment, light traveling towards the sensor head is in the "first polarization modes" of the first and second branches. The assembly of the first and second branches between the connectors and the beam splitter is asymmetric as expressed by the following equation:

$$\text{abs}(L11+L21-L12-L22)>Lc \text{ with}$$

L11 being the optical path length of the first polarization mode in the first branch between the first connector and the select beam splitter, L12 being the optical path length of the second polarization mode in the first branch between the first connector and the select beam splitter, L21 being the optical path length of the first polarization mode in the second branch between the second connector and the select beam splitter, and L22 being the optical path length of the second polarization mode in the second branch between the second connector and the select beam splitter.

Lc, as mentioned above, is the coherence length of the light from the light source.

The function abs(x) designates the absolute value of x.

In this context, an "optical path length" of a polarization mode is to be understood as the integral of the product of the group refractive index (as seen by light of this polarization mode) and the geometrical length of the path integrated along the path. For example, if the first polarization of the first branch sees a refractive index n1 along the whole path between the first connector and the first coupler, and this path has a geometrical length l1, the optical path length is equal to the product n1·l1.

The invention is based on the understanding that, as described in more detail below, a misalignment of the connectors leads to the insertion of cross-coupled light into undesired polarization modes in the branches between the connectors and the second beam splitter. This cross-coupled light travels to the sensor head and back, where it arrives as incoming light at the detector, together with incoming primary light (i.e. the non-cross-coupled light) that also comes back from the sensor head. For a symmetric arrangement of the assembly of the first and second branches between the connectors and the select beam splitter, the incoming cross-coupled light can have or can obtain components that are coherent with the incoming primary light, which in turn will lead to signals that generate an error in the measured data. However, by using an asymmetric design as described above, the incoming stray light will not be coherent with the incoming primary light and therefore will not or only weakly affect the interferometric measurement.

The present invention modifies the FOCS optical circuit in a way that a path difference between the primary waves and the cross-coupled secondary waves is generated. The path difference is larger than the coherence length of the light source so that the secondary (cross-coupled) waves no longer interfere with the primary waves. As a result, the influence of the secondary waves on the sensor signal is drastically diminished. While in prior art polarization-cross coupling at the connector must stay below −33 dB to limit signal changes at changing cross-coupling to <0.1%, a much less challenging limit of only e.g. −16.5 dB is required with the present invention.

In a typical embodiment, the first branch comprises a first and a second birefringent fiber section connected under a mutual angle of 90° between their slow fiber axes, e.g. at a 90°-splice. Advantageously, on the other hand, the second branch does not comprise a first and a second birefringent fiber section connected under a mutual angle of 90°, but rather only a single birefringent fiber section. (Note: Herein, the term "single birefringent fiber section" includes also a fiber section that is composed of two or more birefringent fiber sections that are joint by 0°-splice(s), i.e. the slow axes of the joint fiber sections are parallel).

In that case (i.e. when there are two such fiber sections in the first branch), these fiber sections can meet:

(a) at a location between said first connector and said select beam splitter;

(b) at a location between said first connector and the beam splitter that is not the select beam splitter; or (c) at the first connector.

Variant (a) allows to locate the connector close to the detector. Variant (b) provides a simpler design for the components that are located between the connector and the sensor head. Variant (c) allows to integrate the 90°-splice functionality in the connector.

In another advantageous embodiment, the sensor can comprise at least one phase modulator adapted to modulate the phase of the light in the first and/or the second branch. Hence, the two branches can be used for phase modulation detection techniques.

The sensor can comprise a cable assembly between (i.e. in the optical path between) the connectors and the sensor head. This cable assembly comprises said connecting fiber and said second beam splitter, and it ends in a first and a second coupling member of said first and said second connector, respectively.

Other advantageous embodiments are listed in the dependent claims or claim combinations as well as in the description below.

BRIEF DESCRIPTION OF THE DRAWINGS

The invention will be better understood and objects other than those set forth above will become apparent from the following detailed description thereof. Such description makes reference to the annexed drawings, wherein.

MODES FOR CARRYING OUT THE INVENTION

Definitions

A "polarization mode" of a waveguide, in particular a fiber, is understood to designate one or more waveguiding modes that have a common light polarization.

A waveguide or fiber having "a first and a second polarization mode", or any similar expression, is understood to designate a waveguide having a first waveguiding mode (or modes) and a second waveguiding mode (or modes) in which the light has different polarizations.

A "beam splitter" is a device that allows to split light from a source channel into at least two branches or to combine light from at least two branches into a common destination channel. For example, such a beam splitter can e.g. be a fiber coupler, an integrated beam splitter and/or a device exploiting partial reflection on surfaces.

Figure 1:
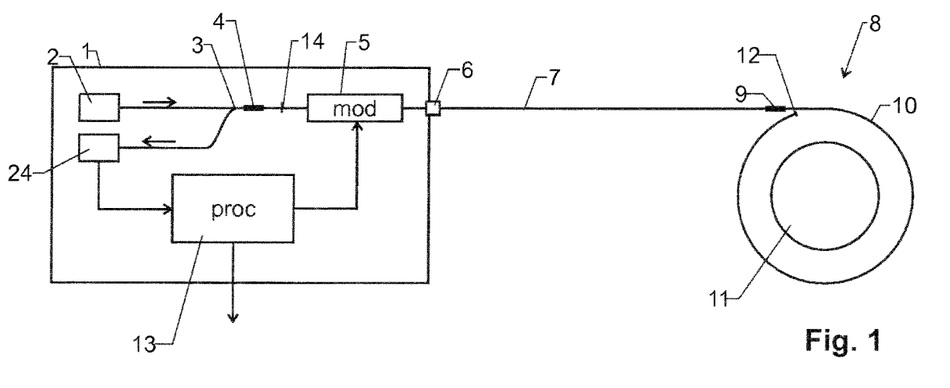
FIG. 1 shows a sensor configuration with birefringence modulator and PM fiber connector (prior art)

Prior-Art Sensor Configurations with Polarization-Maintaining Fiber Connectors FIG. 1 depicts a fiber-optic current sensor according to prior art [1, 2, 6].

It comprises an opto-electronics module 1 having a light source 2. The light from light source 2 is sent through a 1×2 fiber coupler 3 and a polarizer 4 into a phase modulator 5 and from there to a connector 6. Two linearly polarized light waves with orthogonal polarization directions are sent through a polarization-maintaining connecting fiber 7 to a sensor head 8. Polarizer 4 is typically a fiber polarizer. It may be represented of a polarizing fiber or a discrete polarizer element with fiber pigtails. In the latter case at least the coil-side pigtail is a polarization maintaining fiber.

Sensor head 8 comprises a fiber-optic quarter-wave retarder 9 (a short piece of birefringent fiber of appropriate length) that receives the light from connecting fiber 7 and sends it into a sensing fiber 10, which is coiled around the current conductor 11 in which the current is to be measured. A mirror 12 is arranged at the end of sensing fiber 10. Typically, mirror 12 is realized as a reflective coating on the fiber tip.

Typically, light source 2 is a broadband semiconductor source such as a superluminescent diode. Quarter-wave retarder 9 at entrance of sensing fiber 10 converts the linear waves into left and right circularly polarized light waves. The waves are reflected at the far end of sensing fiber 10 by mirror 12, then they retrace their optical path back to optoelectronics module 1 with swapped polarization states, and they finally interfere with each other at fiber polarizer 4.

The two light waves accumulate a differential magneto-optic phase shift $\Delta\phi$ in the fiber coil as a result of the Faraday effect. It is measured by means of a closed-loop detection circuit operated by a processing unit 13 that controls phase modulator 5, which modulates the differential phase of the orthogonal polarization states. Commonly, an integrated-optic lithium niobate modulator is employed. The magneto-optic phase shift $\Delta\phi$ is given as $\Delta\phi=4\varphi_F$ with $\varphi_F=V \cdot N \cdot I$. V is the Verdet constant of the fused silica sensing fiber (1.0 μrad/A at 1310 nm), N the number of fiber coil loops, and I the current. Instead of closed loop, open-loop detection may be employed. In the latter, simpler piezo-electric modulators are often utilized [1, 2]. Details are described in [3].

In view of the following sections, it should be noted that with a low-coherent source the orthogonal light waves lose their coherence during their propagation from a 45°-splice 14 after fiber polarizer 4 towards sensing fiber 10 as a result of the differential group delay in the PM connecting fiber 7 and modulator 5. Since the waves return from mirror 12 with swapped polarization states, the group delay is reversed on the return path and coherence is restored when the waves again arrive at polarizer 4. At ideal conditions the interference fringe visibility K defined as $K=(I_1-I_2)/(I_1+I_2)$ is then equal to unity. Here, $I_1$, $I_2$ are the light intensities at constructive and destructive interference, respectively.

Commonly the light from light source 2 is depolarized by a fiber-optic Lyot depolarizer (not shown), which is placed between light source 2 and fiber coupler 3.

Figure 2:
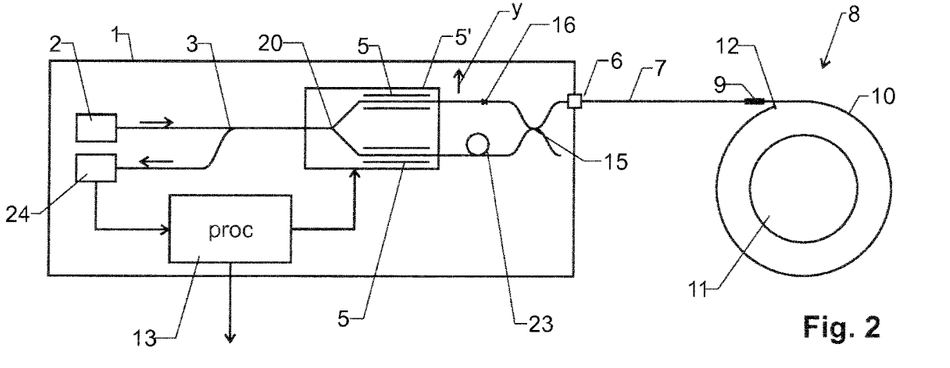
FIG. 2 shows a sensor configuration with y-type modulator and PM fiber connector.

FIG. 2 depicts a modified sensor configuration that allows using a y-branch integrated-optics phase modulation module 5' with two integrated phase modulators 5 operated with opposite phase as often used in fiber gyroscopes rather than a birefringence modulator [4, 5]. In the given example, the waveguides of modulation module 5' are made by proton exchange. As a result, they only support the polarization in the plane of the chip, i.e. modulation module 5' also acts as a polarizer. The two forward propagating light waves, emerging with parallel linear polarizations from the modulator (polarization along y, with y being parallel to the chip plane) are combined to orthogonal waves in a polarization maintaining beam splitter 15. To this purpose, one of the two input fiber leads of beam splitter 15 is spliced at a splice 16 to the fiber from the modulator with a 90°-offset in the orientation of the birefringent axes. Sensor head 8 is the same as in FIG. 1. The returning orthogonal waves are split at splitter 15 into the upper and lower fiber branches, so that a pair of orthogonal waves couples into each of the two modulator branches. The two waves polarized parallel to the transmission direction of modulation module 5' (y-direction), having traveled along reciprocal paths, are brought to interference. The other two waves with polarization along x are blocked by the polarizing modulator. These waves have travelled along non-reciprocal paths, as one wave has propagated forth and back through the upper fiber branch, whereas the other wave has travelled through the lower branch. The unequal lengths of the two fiber branches (delay loop in the lower branch) prevents interference of these waves in case they should partially leak through the modulator. The optical path difference of the waves returning with x-polarization corresponds to twice the delay loop length and is much longer than the coherence length Lc of broadband light source 2.

In high voltage substations for electric power transmission, the opto-electronics module 1 of the sensor is on ground potential (e.g. in an outdoor cubicle or in the substation control house) and the sensor head (fiber coil) 8 is on high voltage potential (e.g. on top of a free-standing support insulator or integrated into a circuit breaker) with a polarization maintaining connecting fiber 7 between them. It has been known to connect connecting fiber 7 to opto-electronics module 1 by means of a connector 6, which is located between modulator 5' and connecting fiber 7 (sensor configuration according to FIG. 1) or between beam splitter 15 and connecting fiber 7 (sensor configuration according to FIG. 2) [6].

Preferably, connector 6 is mounted at the housing of the opto-electronics module 1. A connector is desirable, since it makes installation and replacement of the sensor modules easier and it avoids the need of fiber splicing in the field. On the other hand, connectors can be a source of adverse cross-talk between the two orthogonal polarization modes that propagate in the fiber. Cross-talk results from tolerances in the angular alignment of the principal axes of the two joint fiber sections and from stress originating from gluing the fibers into the connector ferrules. The axis alignment can change at repeated connector opening/closing due to mechanical tolerances of the various connector parts and due to changing fiber stress in the connector ferrules. Typically, stress also changes with time and temperature. Since cross-talk affects the sensor scale factor, it must be kept below critical limits. If the sensor is used for electricity metering, the connector should affect the scale factor by significantly less than 0.1%. To this end, the polarization cross-coupling must stay below −33 dB. This corresponds to a maximum allowed misalignment between the fiber axes of only 1.2°. Typical commercially available PM connectors maintain the polarization only within about >−25 dB. In prior art a change in cross-talk between −25 dB and −22 dB changes the sensor signal by 0.6%. (The corresponding misalignment angles are 3.2° and 4.5°, respectively). In many sensor applications, such variations are not acceptable. Note: As a matter of principle, finite polarization cross-talk of e.g. 25 dB still results in a stable sensor signal as long as the cross-talk remains constant. The modified sensor scale factor can be taken into account by calibration. However, as noted, such cross-talk generally changes at connector open/close operations and with time and temperature, which can result in signal changes significantly larger than 0.1% or 0.2%.

Polarization Cross-Coupling at Connector and Influence on Sensor Signal (Prior Art)

The normalized sensor signal S as a function of an angular offset α of the principal fiber axes between the two sides of a connector can be determined from a Jones matrix description of light propagation and, assuming that the Faraday-effect induced phaseshift is $4\varphi_F \ll 1$, is given by $$S=1/\cos(2\alpha). \tag{1}$$

Figure 3:
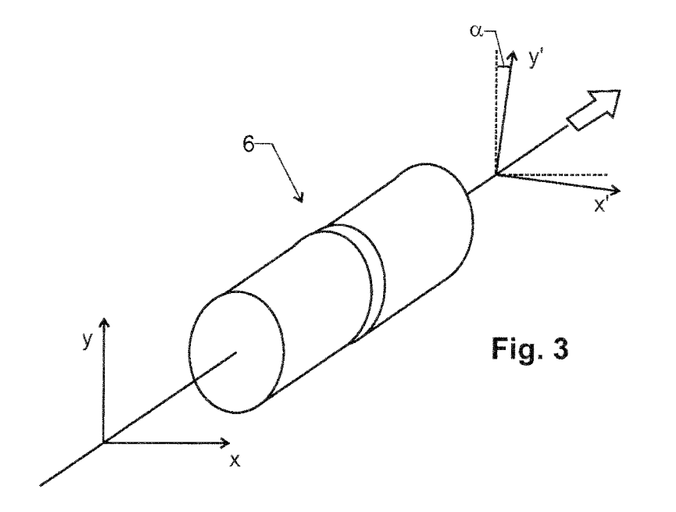
FIG. 3 shows the polarization cross-coupling at fiber connector: The principal fiber axes x', y' in the $2^{nd}$ connector ferrule are rotated (misaligned) by an angle α with respect to axes x, y in the first ferrule; as a result the forward propagating pair of orthogonal waves with polarizations along x and y splits into two pairs of orthogonal waves with polarizations along x' and y'.

Herein, the sensor signal at perfect alignment is assumed as equal to unity. Eq. (1) is valid for the sensor configurations of FIGS. 1, 2 with connector locations as indicated (state of the art). An angular offset results in polarization cross-coupling and thus in a secondary pair of light waves propagating towards the fiber coil (FIG. 3).

Figure 4:
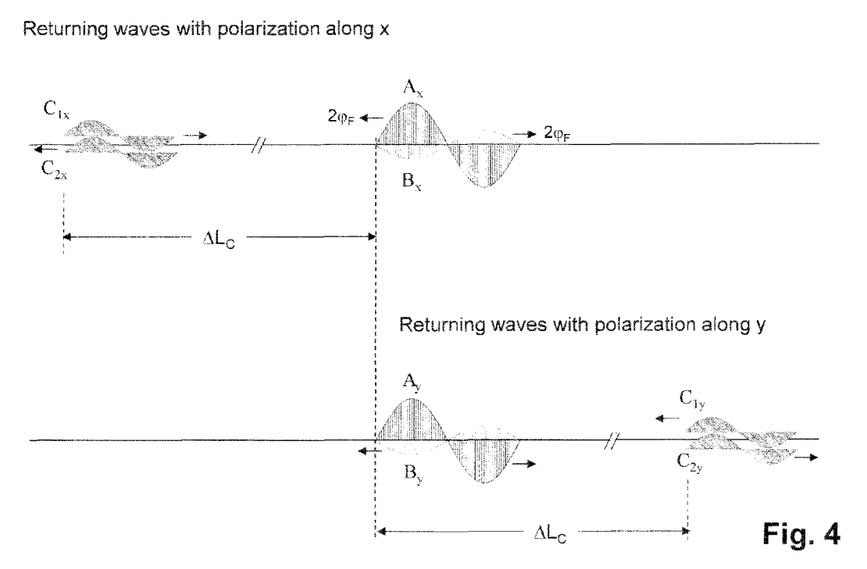
FIG. 4 shows light waves with polarizations along x and y returning to the opto-electronics module (after the $2^{nd}$ pass through the connector) in case of polarization cross-coupling at the connector for sensor configurations of FIGS. 1, 2 (prior art)—the relative phases of the light waves are valid for zero current ($\varphi_F$=0), and if current is applied, the waves shift in phase by amounts $2\varphi_F$ in direction as indicated by arrows.

On the return path, both the primary waves and the secondary waves are subjected to further cross-coupling at the connector. As a result, there are four pairs of orthogonal light waves arriving at the polarizer (FIG. 4): A pair of orthogonal main waves $A_x$, $A_y$, with amplitudes $\cos^2 \alpha$, and which did not experience any cross-coupling (here the amplitude of the original waves is assumed as unity); a pair of tertiary waves $B_x$, $B_y$, with amplitudes $\sin^2 \alpha$, which result from cross-coupling on both paths, i.e. the forward and return path, and two pairs $C_{1x}$, $C_{1y}$, $C_{2x}$, $C_{2y}$ with amplitudes $\cos \alpha \cdot \sin \alpha$, which result from singular cross-coupling on the forward path or return path. The amplitudes and phases of the waves can be written as $$A_x = \cos^2 \alpha \cdot \exp(-2i\varphi_F)$$

$$B_x = -\sin^2 \alpha \cdot \exp(2i\varphi_F)$$

$$C_{1x} = \cos \alpha \cdot \sin \alpha \cdot \exp[i(\Delta\theta + 2\varphi_F)]$$

$$C_{2x} = \cos \alpha \cdot \sin \alpha \cdot \exp[i(\Delta\theta - 2\varphi_F)]$$

$$A_y = \cos^2 \alpha \cdot \exp(2\varphi_F)$$

$$B_y = -\sin^2 \alpha \cdot \exp(-2\varphi_F)$$

$$C_{1y} = \cos \alpha \cdot \sin \alpha \cdot \exp[-i(\Delta\theta + 2\varphi_F)]$$

$$C_{2y} = \cos \alpha \cdot \sin \alpha \cdot \exp[-i(\Delta\theta - 2\varphi_F)] \tag{2}$$

Herein, $\Delta\theta$ denotes the quasi-static phase shift as a result of uncompensated differential group delay $\Delta L_C$ (see below).

The waves $B_x$, $B_y$ have a 180°-phase-shift with respect to the $A_x$, $A_y$ waves (due to opposite sense of polarization rotation at the fiber retarder) and experience a magneto-optic phase shift $2\varphi_F$ of opposite direction. The resulting magneto-phase shift of the sum waves $(A_x+B_x)$, $(A_y+B_y)$ is larger than the phase shift $2\varphi_F$ of the individual waves $A_x$, $B_x$, $A_y$, $B_y$ and is given by $2\varphi_F/\cos(2\alpha)$. The detected sensor signal is enhanced according to eq. (1). (Note: The reason for the opposite Faraday phase shift of the B waves is the fact that they have propagated through the fiber coil with circular polarization of sense opposite to the sense of the A waves as a result of the cross-coupling.)

The differential group delay between x and y polarization in the fiber link for the pairs of C waves, $C_{1x}$, $C_{1y}$ and $C_{2x}$, $C_{2y}$ is not fully compensated on the return path. The remaining delay with respect to the A and B waves is $\pm\Delta L_C$. Here, $\Delta L_c = \Delta L_{PM1} + \Delta L_M + \Delta L_{PM2}$ is the differential delay on the path from the connector back to the 45°-splice (FIG. 1) and is composed of the delay in the PM fiber sections $\Delta L_{PM1}$, $\Delta L_{PM2}$ before and after the modulator and the delay $\Delta L_M$ in the modulator itself. As this delay is much larger than the coherence length of light source 2, the waves pairs $C_{1x}$, $C_{1y}$, and $C_{2x}$, $C_{2y}$ are mutually incoherent and thus do not contribute to the detected magneto-optic phase shift. The waves $C_{1x}$ and $C_{2x}$ are in phase at zero current, whereas they extinguish each other at a magneto-optic phase shift of π. The same is true for $C_{1y}$, and $C_{2y}$. At non-zero current, the C waves result in current-dependent background light at the detector (but do not enter into the sensor signal). Note that in the extreme case of α=45°, all returning waves have an amplitude of ½. The A and B waves extinguish each other, and a meaningful signal is no longer obtained.

Note: The sensor signal change may be larger than indicated by eq. (1), if there is polarization-cross coupling not only from connector misalignment, but also from fiber stress in the connector ferrules. Commonly, the main effect is due to misalignment though.

FOCS with Reduced Sensitivity to Connector Polarization Cross-Coupling

Hence, it is desired to substantially reduce the influence on the sensor signal of polarization cross-coupling at the connector in comparison to prior art. We have found theoretically and experimentally that the demands on the polarization extinction ratio (PER) of the PM connectors for a sensor configuration according to FIG. 2 can drastically be relaxed, if the fiber connector is not placed into the fiber line between the beam splitter 15 and connecting fiber 7 (prior art), but if instead a connector is appropriately placed into each of the two branches, e.g. between modulation module 5' and the beam splitter 15.

Figure 5:
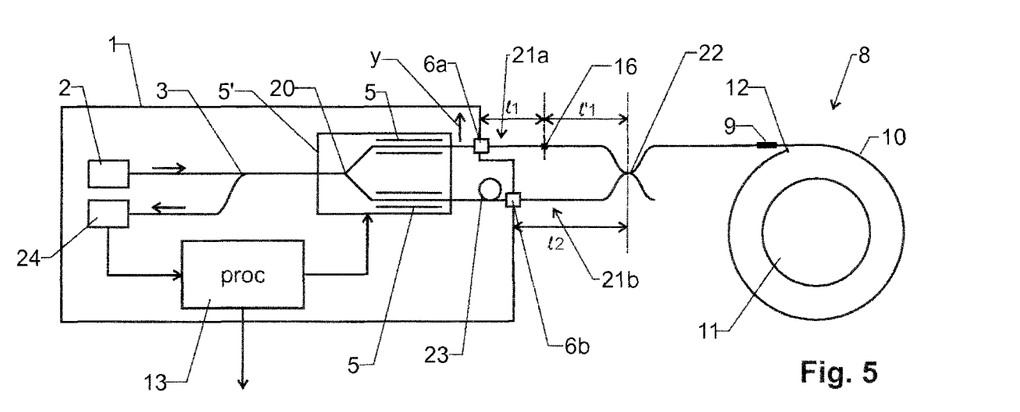
FIG. 5 shows a first embodiment of a sensor configuration with PM fiber connectors.

Such an embodiment is shown in FIG. 5. It again has an opto-electronics module 1, which is typically located at ground potential and is connected to a sensor head 8 by a connecting fiber 7.

Opto-electronics module 1 comprises a light source 2, which can e.g. be a broadband semiconductor light source, such as a superluminescent diode, and which generates light with a coherence length Lc. The light from light source 2 is sent through a 1×2 fiber coupler 3 into a modulation module 5'. Modulation module 5' comprises a first beam splitter 20 splitting the beam into two branches 21a, 21b. Modulation module 5' further comprises two phase modulators 5 operated to induce phase shifts of opposite signs into the light waves in the two branches 21a, 21b.

The two branches 21a, 21b are re-combined in a second beam splitter 22. A 90°-splice 16 is arranged between modulation module 5' and second beam splitter 22 in the first branch 21a, while a delay line 23 is arranged between modulation module 5' and second beam splitter 22 in the second branch 21b, just as in the embodiment of FIG. 2. (Delay line 23 may also be located in first branch 21a.)

In contrast to the embodiment of FIG. 2, there are now two connectors 6a, 6b, with a first connector 6a being arranged in first branch 21a and a second connector 6b being arranged in second branch 21b.

Again as in the embodiment of FIG. 2, the two linearly polarized light waves from second beam splitter 22 are sent through a polarization-maintaining connecting fiber 7 and to the sensor head 8.

Sensor head 8 again e.g. comprises a fiber-optic quarter-wave retarder 9 (a short piece of birefringent fiber of appropriate length) that receives the light from connecting fiber 7 and sends it into a sensing fiber 10, which is coiled around the current conductor 11 in which the current is to be measured. A mirror 12 is arranged at the end of sensing fiber 10.

Quarter-wave retarder 9 at the entrance of sensing fiber 10 converts the linear waves into left and right circularly polarized light waves. The waves are reflected at the far end of sensing fiber 10 by mirror 12, then they retrace their optical path back to opto-electronics module 1 with swapped polarization states, and they finally interfere at first beam splitter 20 and the resulting interference signal is detected in a light detector 24.

It must be noted that, at least between the connectors 6a, 6b and second beam splitter 22, the two branches 21a, 21b are able to carry light in a first and a second polarization mode. In the first branch 21a, the first polarization mode e.g. corresponds to a light polarization along direction y of FIG. 5 for the fiber section between connector 6a and 90°-splice 16, and to a polarization perpendicular to the drawing plane between 90°-splice 16 and second beam splitter 22. In the second branch, the first polarization mode corresponds to a light polarization along direction y. The second polarization modes corresponding to light polarizations perpendicular to the first polarization modes.

When each connector 6a, 6b is in perfect angular alignment, light traveling towards the sensor head is in the first polarization modes of the first and second branches 21a, 21b. An angular misalignment of the connectors 6a, 6b will, however, couple light into the other (second) polarization modes.

Figure 6:
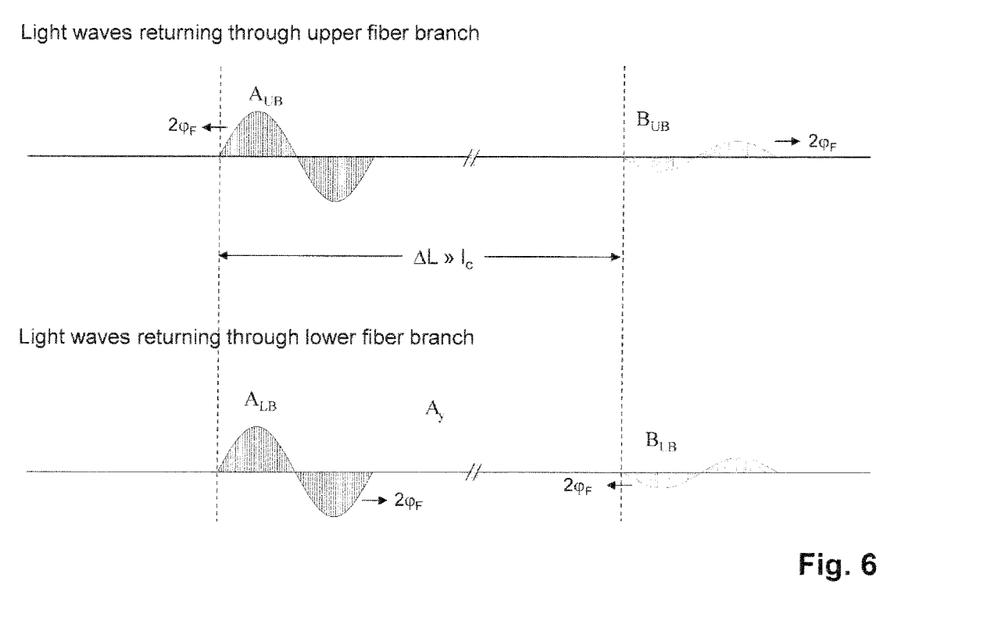
FIG. 6 shows the interfering light waves for the configuration of FIG. 5 in case of polarization cross-coupling at the connectors (with the C waves blocked by modulator being ignored)

The underlying physical principles of this (and the following) embodiments are now explained by reference to FIG. 6, which depicts the light waves interfering at first beam splitter 20 after a round trip through the optical circuit (waves that are blocked by the polarizing modulator module 5' are disregarded).

It is assumed that both connectors 6a, 6b have an angular offset or misalignment angle α. There are two pairs of light waves which interfere:

(i) The two main waves $A_{LB}$, $A_{UB}$, which return through the first and second branches 21a, 21b (LB, UB), respectively, and did not experience any cross-coupling. They are equivalent to the waves $A_x$, $A_y$ in FIG. 3 and are again of amplitude $\cos^2 α$.

(ii) The waves $B_{LB}$, $B_{UB}$ of amplitude $\sin^2 α$, which result from twofold cross-coupling (cross-coupling at each connector 6a, 6b).

A fundamental difference to the situation in FIG. 3 is, however, that the pair of B waves has suffered an optical path delay of ΔL with respect to A waves and thus cannot interfere anymore with the A waves. The delay stems from the fact that the B waves propagate on the forward path from one of the connectors 6a, 6b to the second beam splitter 22 and on the return path from second beam splitter 22 to the other connector 6b, 6a, with a polarization direction orthogonal to the polarization of their primary (parent) waves. The delay is given by the optical path difference $$\Delta L = L11 + L21 - L12 - L22, \quad (3)$$

with

L11 being the optical path length of the first polarization mode in the first branch 21a between first connector 6a and second beam splitter 22, L12 being the optical path length of the second polarization mode in first branch 21a between first connector 6a and second beam 22 splitter, L21 being the optical path length of the first polarization mode in second branch 21b between second connector 6b and second beam splitter 22, and L22 being the optical path length of the second polarization mode in second branch 21b between second connector 6b and second beam splitter 22.

As mentioned, the optical path length is given by the integral of the product of the effective or group refractive index times the geometrical length integrated over the length of the respective channel.

In the embodiment of FIG. 5, first branch 21a consists, between first connector 6a and second beam splitter 22, of two sections having respective lengths l1 and l'1 of fiber sections connected at the 90°-splice 16, while second branch 21b consists, between second connector 6b and second beam splitter 22, of a single fiber section of length l2 (or e.g. several fiber sections connected by 0°-splices). Assuming that all these fiber sections are made of the same type of birefringent fiber with refractive indices n' and n" in their two polarization modes, we have $$L11 = l1 \cdot n' + l'1 \cdot n''$$

$$L12 = l1 \cdot n'' + l'1 \cdot n'$$

$$L21 = l2 \cdot n'$$

$$L22 = l2 \cdot n''$$

and therefore $$\Delta L = L11 + L21 - L12 - L22 \quad (3')$$
$$= (l1 - l'1 + l2) \cdot \Delta n$$

with $\Delta n = n' - n''$ being the group birefringence of the fiber used in the first and second branches.

If, as later described in references to FIGS. 13 and 14, the 90°-splice 16 is not arranged between first connector 6a and second beam splitter 22, but rather between first connector 6a and first beam splitter 20, $\Delta L$ is $$\Delta L = (-l1 + l2) \cdot \Delta n. \quad (3'')$$

The differential magneto-optic phase shift of the B waves is again opposite in sign to the one of the A waves. Light waves that resulted from cross-coupling at one connector only (corresponding to the C waves in FIG. 4, but not shown in FIG. 6) return to the polarizing modulator with polarization along x, therefore are blocked and do not reach detector 24.

As to the B waves, they only interfere with the A waves, if they are coherent with the A waves. In other words, the introduction of a delay $\Delta L > Lc$ (with Lc being the coherence length of the light that is used) between the A and B waves eliminates the coherence between the A and B waves. As a result, the effect of the B waves on the sensor signal is largely reduced. In the embodiments of FIGS. 1 and 2 (prior art), the interference intensity at the detector is determined by the square of the sum of all A and B light fields (taking into account their amplitudes and phases), i.e. by $I \sim (A_x + B_x + A_y + B_y)^2$. In contrast, the interference intensity in the present technology is determined by the square of the sum of A fields plus the square of the sum of the B fields: $I \sim (A_{LB} + A_{UB})^2 + (B_{LB} + B_{UB})^2$. As a consequence, the influence of the B waves on the sensor signal becomes drastically smaller. The opposite Faraday phase shift of B waves now results in a reduction of the sensor signal. The signal as a function of $\alpha$ is then given by $$\cos(2\alpha)/[(1/4)\cos(4\alpha) + 3/4] \quad (4)$$

Figure 7:
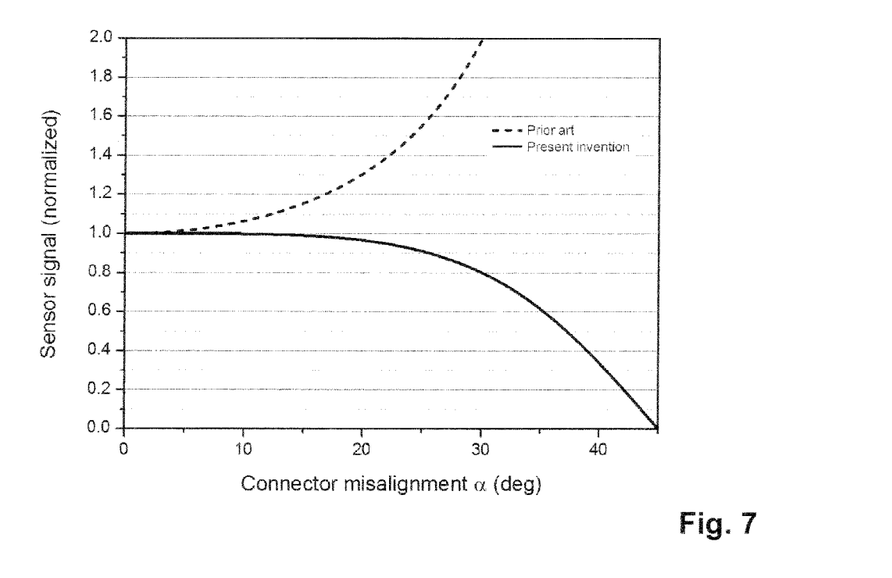
FIG. 7 shows a normalized sensor signal vs. the connector misalignment for fiber-optic current sensors of prior art (dashed line) and according to the present technique (solid line)
Figure 8:
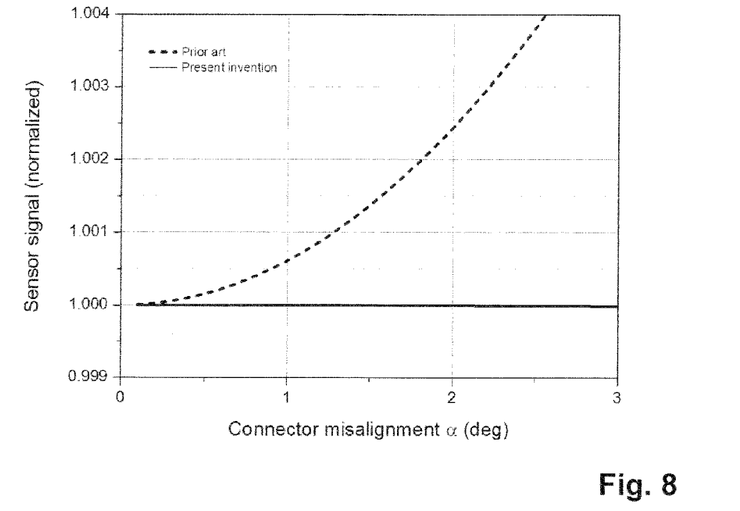
FIG. 8 shows a zoomed section of FIG. 7 for small misalignment angles in the practically relevant range.
Figure 9:
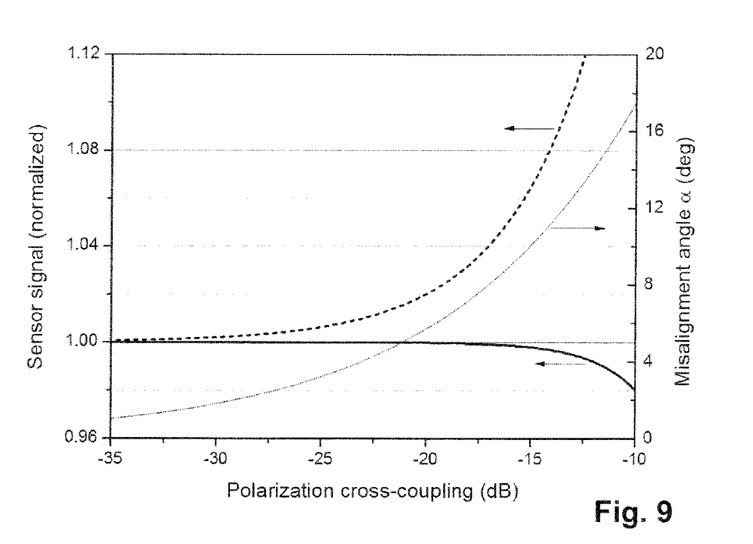
FIG. 9 shows a normalized sensor signal vs. polarization cross-coupling at the fiber connector for fiber-optic current sensors of prior art (dashed line) and according to the present technique (solid line)—the dotted line shows the relationship between the misalignment angle and the polarization cross-coupling.
Figure 10:
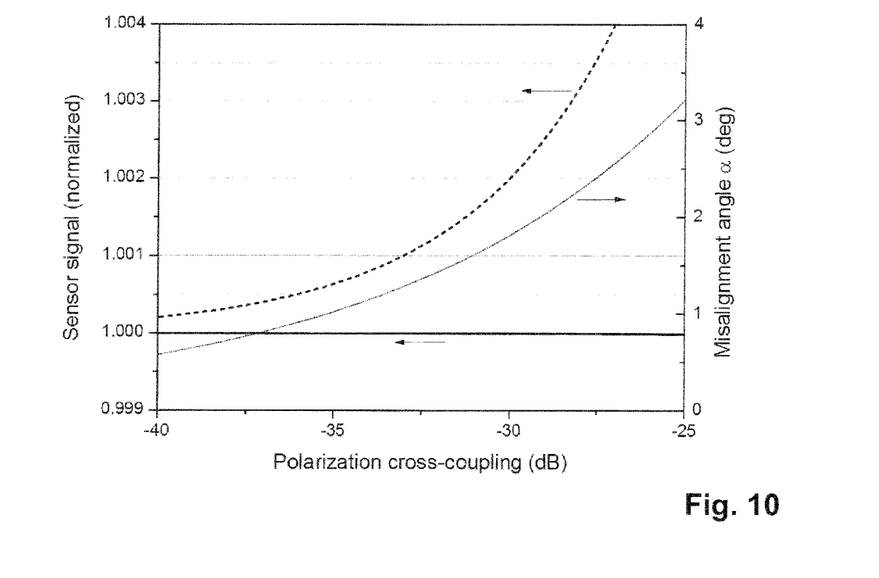
FIG. 10 shows a zoomed section of FIG. 9 for small misalignment angles in the practically relevant range.

Note that the signal disappears at $\alpha = 45°$. The dashed and solid curves in FIGS. 7, 8 show the variation of the sensor signal as a function of the misalignment angle $\alpha$ for the sensor configurations of FIGS. 1, 2 (prior art, eq. (1)) and FIG. 5 (present invention, eq. (4)), respectively. In FIGS. 9, 10 the signal change is plotted as a function of the connector polarization cross-coupling. The polarization cross-coupling is the negative of the polarization extinction ratio (PER). The PER is related to $\alpha$ by (dotted curve in FIGS. 9, 10):

$$PER(dB) = -10 \log(\tan^2 \alpha) \quad (5)$$

It is apparent from FIGS. 7-10 that in prior art (dashed curves) a cross-coupling of −30 dB (corresponding to a relative misalignment between the two connector sides by 1.8°, which can easily occur with state-of-the art PM connectors) causes a signal change of 0.2% (with respect to a perfect connector), i.e. the sensor is then at the boundary for metering with class 0.2 accuracy. In contrast, with the present technology (solid curves) a signal change of 0.2% would occur only at a misalignment by 10.04°, corresponding to polarization cross-coupling of −15 dB. The present technology thus drastically reduces the demands on the PM connectors. Even misalignment within ±5 degrees changes the sensor signal by not more than about ±0.01%.

In practical sensor applications, the connectors are preferably mounted at a wall of a housing of the opto-electronics 1.

Figure 11:
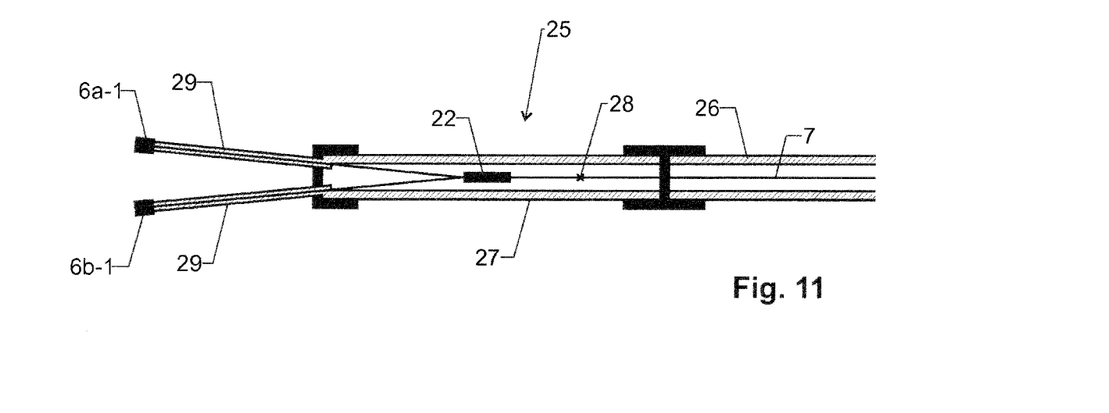
FIG. 11 shows a PM coupler as part of a fiber cable assembly.

Each connector 6a, 6b comprises a first and a second connector member, which mate when closing the connector. In an advantageous embodiment, as shown in FIG. 11, the first connector members 6a-1, 6b-1 are part of a cable assembly 25 arranged between the connectors 6a, 6b and the sensor head 8. Cable assembly 25 comprises a flexible cable body 26 surrounding connecting fiber 7 and a terminal section 27 containing second beam splitter 22 as well as a splice 28 connecting second beam splitter 22 to connecting fiber 7. Two fan-outs 29, with the connector members 6a-1, 6b-1 at their ends, terminate cable assembly 25.

For redundancy purposes, cable assembly 25 may contain two connecting fibers and hence two second beam splitters with four connector members for four connectors.

Terminal section 27 can be flexible or rigid.

Second beam splitter 22 e.g. may be a fused fiber coupler or a coupler made by fiber side-polishing. A preferred coupler version is a fused PM coupler made from elliptical core fiber having a small temperature coefficient of the fiber birefringence. Alternatively, an integrated optic waveguide splitter or a fiber pigtailed bulk polarizing beam splitter may be used.

Instead of using two separate connector pairs in the two branches of the optical circuit, it is conceivable to use a common connector pair with each connector ferrule having bores for two fibers.

Figure 12:
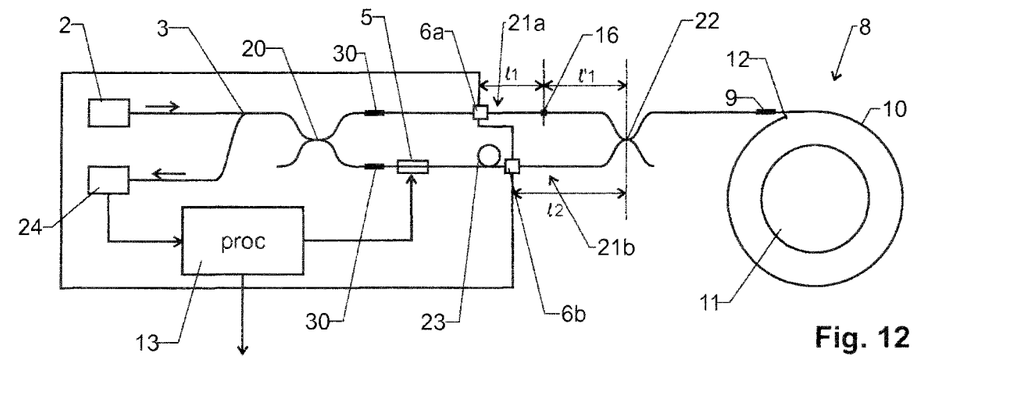
FIG. 12 shows a second embodiment of a sensor configuration with PM fiber connectors.
Figure 13:
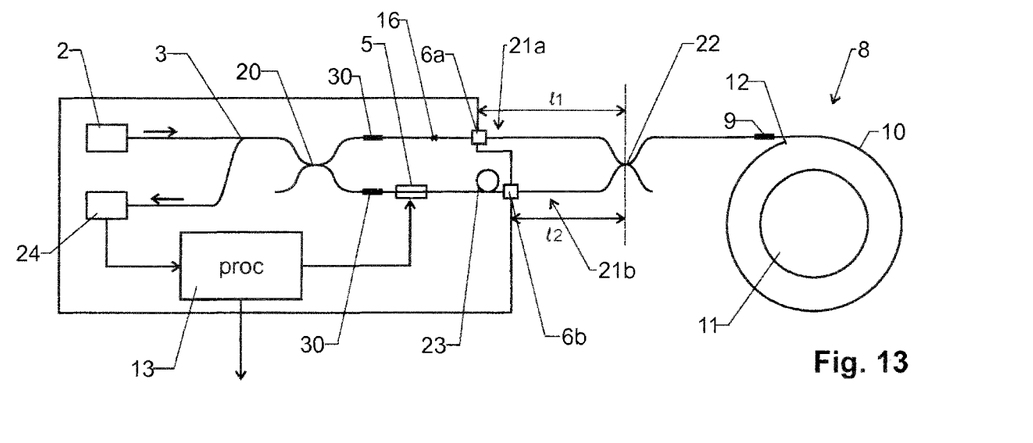
FIG. 13 shows a third embodiment of a sensor configuration with PM fiber connectors.
Figure 14:
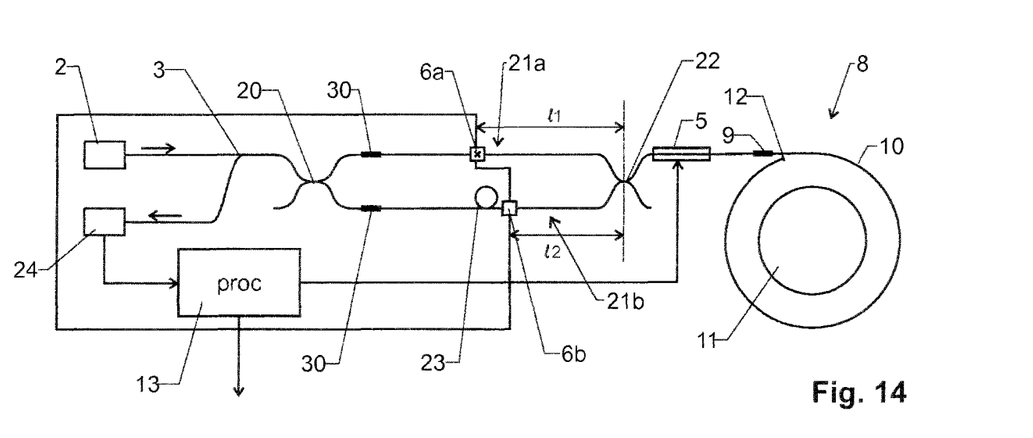
FIG. 14 shows a fourth embodiment of a sensor configuration with PM fiber connectors.

FIGS. 12-14 illustrate some of the possible modifications of the sensor configuration of FIG. 5.

In the embodiment of FIG. 12, the polarizing y-branch modulator module is replaced by a combination of a PM fiber coupler (which forms first beam splitter 20), followed by two fiber polarizers 30 and an integrated-optic phase modulator 5 (preferably a lithium niobate modulator that is adapted to introduce a differential phase modulation between the interfering light waves. Instead of a lithium niobate modulator, a piezoelectric modulator may be used in one (or both) fiber branches [4].

It should be noted that, compared to the sensor configuration of FIG. 1, the configuration of FIG. 12 is not only more tolerant to polarization cross-coupling at the fiber connectors, but is equally tolerant to cross-coupling at modulator 5. This means that the demands on the polarization extinction ratio of modulator 5 are relaxed in the same way as they are relaxed for the connectors.

The positions of the y-type modulator module 5' and second beam splitter 22 in FIG. 5 can be exchanged. In this case, however, the modulator module must support both orthogonal polarization modes. In this case, the group delay required by eq. (3) will largely be introduced by the modulator, i.e. the fiber sections from the modulator module to the connectors can have the same or similar lengths. This is particularly convenient, if a common connector pair (ferrules with two fiber bores) is used for the two branches.

Instead of using two polarizers after first beam splitter 20, a single polarizer before first beam splitter 20 may be used.

As mentioned and as illustrated in FIG. 13, 90°-splice 16 can be arranged between first beam splitter 20 and first connector 6a.

Furthermore, in a less advantageous solution, modulator 5 may be placed after second beam splitter 22, as shown in FIG. 14, where it acts, like in FIG. 1, as a birefringence modulator. (Here, the modulator becomes, together with the beam splitter, part of cable assembly 25).

FIG. 14 also illustrates that 90°-splice 16 can be dispensed with, if first connector 6a takes over its function, i.e. if first connector 6a swaps the polarizations by 90° between the fibers it connects.

In principle photodetector 24 in FIGS. 12-14 can also be connected to the free fiber end of the source-side PM coupler (first beam splitter 20), which saves the initial 1×2 coupler 3. This is not a preferred arrangement, however, because the optical paths of the interfering light waves through the coupler become non-reciprocal, which can give rise to instability of the detected signal.

Figure 15:
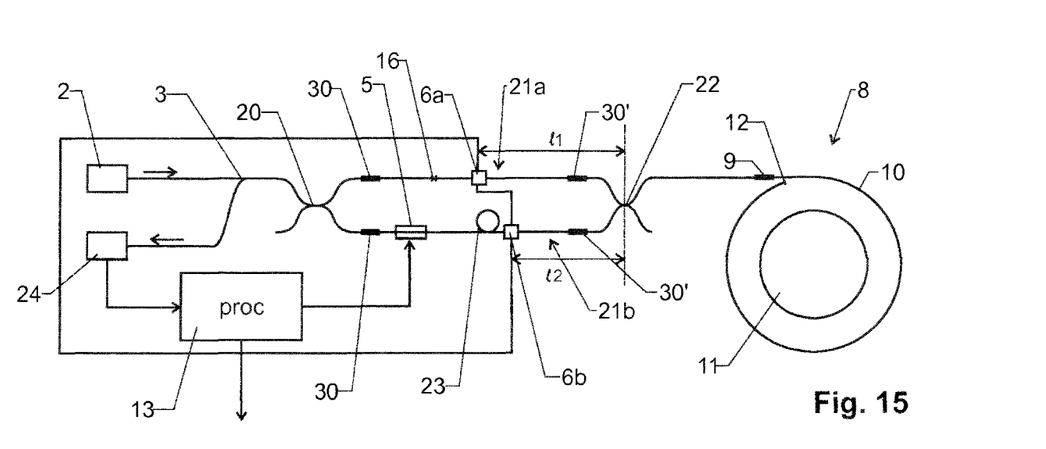
FIG. 15 shows a fifth embodiment of a sensor configuration with PM fiber connectors.

FIG. 15 shows a sensor configuration with polarizers 30, 30' both before and after the connectors 6a, 6b, i.e. it differs from the embodiment of FIG. 13 in that there is a second set of polarizers 30' between the connectors 6a, 6b and second beam splitter 22, with one second polarizer 30' in each of the branches 21a, 21b. (Again, the polarizers 30, 30' may be made from polarizing fiber or discrete polarizer elements with polarization-maintaining fiber pigtails on both sides.) The polarizers 30, 30' before and after the connectors 6a, 6b suppress any light waves that are cross-coupled at the connectors during the forward or backward propagation, i.e. only A-waves contribute to the signal. Hence, the measured magneto-optic phase shift becomes independent of α. (The signal-to-noise ratio will decrease with increasing α, though). In this case, the above requirements on the connector location (eq. 3', 3") need not be observed when assuming perfect polarizers. (In case of imperfect polarizers, connector positioning according to eq. 3', 3" is still of advantage). Alternatively, instead of the two polarizers between first coupler 20 and connectors 6a, 6b, only a single polarizer at the source side of first coupler 20 may be used, i.e. in the light path between coupler 3 and coupler 20.

Figure 16:
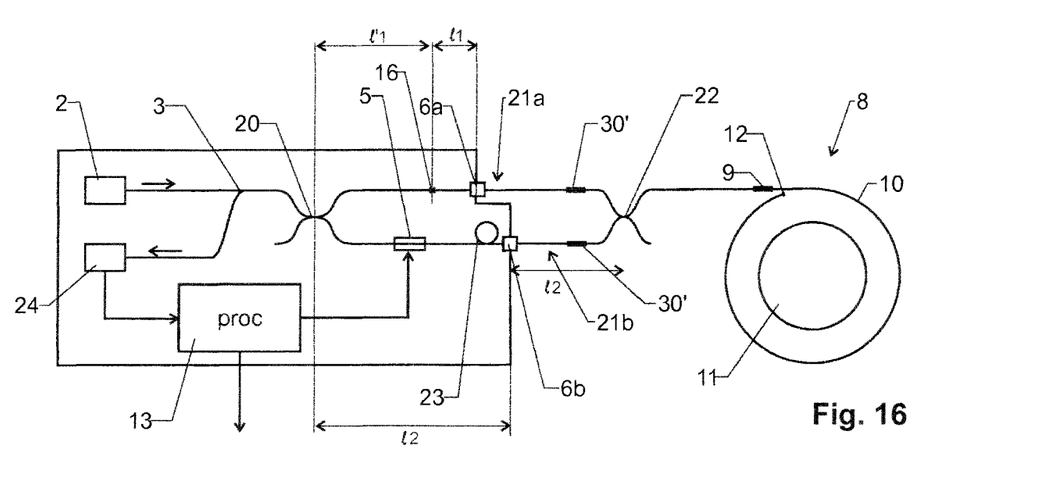
FIG. 16 shows a sixth embodiment of a sensor configuration with PM fiber connectors.

FIG. 16 shows a further but less advantageous sensor configuration with polarizers 30' between connectors 6a, 6b and second coupler 22, i.e. without any polarizers 30 between first coupler 20 and the connectors 6a, 6b. Here, eq. 3', 3" must again be observed, but now applied to the fiber sections between first coupler 20 and connectors 6a, 6b, as denoted by the lengths l1, l'1 and l2 in FIG. 16. Furthermore, the differential group delay between the orthogonal modes in each of the two fiber sections between first coupler 20 and connectors 6a, 6b must be larger than the coherence length Lc.

Hence, in other words, in the embodiment of e.g. FIG. 13, the branches 21a, 21b are adapted to carry light in a first and a second polarization mode between the connectors 6a, 6b and second beam splitter 22. On the other hand, in the embodiment of FIG. 16, the branches 21a, 21b are adapted to carry light in a first and a second polarization mode between the connector 6a, 6b and first beam splitter 20. Hence, in more general terms encompassing both embodiments, the branches 21a, 21b are adapted to carry light in a first and a second polarization mode between the connector 6a, 6b and "select" one of said first and second beam splitters 20, 22. In the embodiment of FIG. 13 (as well as in the embodiments of FIGS. 5, 12, 14), the select beam splitter is the second beam splitter 22.

In the embodiment of FIG. 16, the select beam splitter is the first beam splitter 20.

In general embodiments of this invention, and applicable to all other embodiments disclosed herein, it is preferred that the first releasable connector 6a in the first branch 21a and the second releasable connector 6b in the second branch 21b are arranged in positions such, that the sensor head 8 is detachable or is bodily separable from the light source 2 and/or from the detector 24, preferably from the light source 2 and the detector 24, by disconnecting the first releasable connector 6a and the second releasable connector 6b.

In yet further general embodiments of this invention, and applicable to all other embodiments disclosed herein, it is further preferred that the first releasable connector 6a in the first branch 21a and the second releasable connector 6b in the second branch 21b are arranged in positions such, that a first group of components comprising the sensor head 8 and the second beam splitter 22 is detachable or is bodily separable from a second group of components comprising the light source 2, the detector 24 and the first beam splitter 20 by disconnecting the first releasable connector 6a and the second releasable connector 6b.

NOTES

In the above sensor configurations, polarization cross-coupling does not only occur at the connectors 6a, 6b and at modulator 5, but to a certain extent also at splices between the various PM fiber sections. Such fiber sections are for example the pigtails of modulator 5 or modulator module 5' and the connectors 6a, 6b. In order to avoid disturbance of the sensor signal by secondary light waves that result from cross-coupling at splices, the lengths of the individual fiber sections should be chosen within ranges such that the pairs of secondary waves accumulate roundtrip group delays that are longer than the coherence length Lc of the light source. In the sensor configurations of the present technique, the lengths of the PM fiber sections in the two branches 21a, 21b (which include the modulator and connector pigtails) can be chosen freely, apart from the restriction given by eq. (3). This gives more flexibility in the sensor assembly and facilitates a potential exchange of the opto-electronics module.

As mentioned, modulator 5 can be an electro-optic modulator, in particular using the Pockels effect, or it can comprise a piezo-actuator acting on a waveguide in order to modulate the refractive index of said waveguide.

REFERENCES

1. DE 4224190 B4, priority 22 Jul. 1992. Applicant: ABB Research Ltd. Inventor: Guido Frosio.

2. K. Bohnert, P. Gabus, J. Nehring, and H. Brändle, "Temperature and vibration insensitive fiber-optic current sensor", Journal of Lightwave Technology 20(2), 267, 2002.
3. H. Lefevre, "The fiber-optic gyroscope", Boston, Mass.: Artech House 1993.
4. EP 1 154 278 A2, priority May 5, 2000, Applicant: ABB Research Ltd. Inventor: Klaus Bohnert.
5. K. Bohnert, P. Gabus, J. Nehring, H. Brandle, and M. G. Brunzel, "Fiber-optic current sensor for electro-winning of metals", Journal of Lightwave Technology 25(11), 3602, 2007.
6. WO 2011/069558 A1, priority Nov. 12, 2009. Applicant: ABB Research Ltd. Inventors: K. Bohnert, A. Frank, R. Wüest.

REFERENCE NUMBERS

1: Opto-electronics module
2: light source
3: fiber coupler
4, 30, 30': polarizer, typically fiber polarizer
5, 5': modulator
6, 6a, 6b: connectors
7: connecting fiber
8: sensor head
9: quarter-wave retarder
10: sensing fiber
11: current conductor
12: mirror
13: processing unit
14: 45° splice
15: beam splitter
16: 90° splice
20: first beam splitter
21a, 21b: branches
22: second beam splitter
23: delay line
24: light detector
25: cable assembly
26: sheath
27: terminal section
28: splice
29: fan-outs

The invention claimed is:

1. A fiber-optic current sensor comprising
a light source generating light with a coherence length Lc,
a first beam splitter splitting the light from said light source into a first and a second branch,
a second beam splitter combining the light from said first and second branches,
a polarization-maintaining connecting fiber adapted to carry light in first and second, mutually orthogonal polarization modes and receiving light from said second beam splitter for a first passage through said connecting fiber,
a sensor head, wherein said sensor head is adapted and structured to receive light waves from said first and said second polarization mode of said connecting fiber, to generate a current-dependent phase shift between said light waves, and to reflect said light waves back into said connecting fiber with switched polarizations for a second passage through said connecting fiber,
a detector located to detect a light intensity resulting from the interference of said light waves after their second passage through said connecting fiber,
a first releasable connector in said first branch, and
a second releasable connector in said second branch,
wherein said first branch is adapted to carry light in a first and a second polarization mode between said first connector and a select one of said first or said second beam splitters, and
wherein said second branch is adapted to carry light in a first and a second polarization mode between said second connector and said select beam splitter,
wherein without angular misalignment of said connectors, light traveling towards the sensor head is in the first polarization modes of the first and second branches.

2. The sensor of claim 1,
wherein $$abs(L11+L21-L12-L22)>Lc \text{ with}$$

L11 being an optical path length of the first polarization mode in the first branch between the first connector and the select beam splitter,
L12 being an optical path length of the second polarization mode in the first branch between the first connector and the select beam splitter,
L21 being an optical path length of the first polarization mode in the second branch between the second connector and the select beam splitter, and
L22 being an optical path length of the second polarization mode in the second branch between the second connector and the select beam splitter.

3. The sensor of claim 2, wherein said first branch comprises a first and a second birefringent fiber section connected under a mutual angle of 90° between their fast and slow principal axes.

4. The sensor of claim 3, wherein said first and said second birefringent fiber sections meet at a location between said first connector and said select beam splitter.

5. The sensor of claim 3, wherein said first and said second birefringent fiber sections meet at a location between said first connector and the beam splitter that is not the select beam splitter.

6. The sensor of claim 3, wherein said first and said second birefringent fiber sections meet at said first connector.

7. The sensor of claim 3, wherein the first releasable connector in the first branch and the second releasable connector in the second branch are arranged in positions such, that a first group of components comprising the sensor head and the second beam splitter is detachable from a second group of components comprising the light source, the detector and the first beam splitter by disconnecting the first releasable connector and the second releasable connector.

8. The sensor of claim 3, comprising at least one phase modulator adapted to modulate a phase of the light in the first and/or in the second branch.

9. The sensor of claim 1, comprising at least one phase modulator adapted to modulate a phase of the light in the first and/or in the second branch.

10. The sensor of claim 9, wherein said phase modulator is arranged between said connectors and said first beam splitter.

11. The sensor of claim 10, further comprising a modulator module integrating said first beam splitter, said modulator and at least one polarizer for polarizing the waves propagating from said modulator module towards said second beam splitter.

12. The sensor of claim 9, further comprising a modulator module integrating said first beam splitter, said modulator and at least one polarizer for polarizing the waves propagating from said modulator module towards said second beam splitter.

13. The sensor of claim 1, further comprising a cable assembly arranged between said connectors and said sensor head, wherein said cable assembly comprises said connecting fiber and said second beam splitter and ends in a first and a second connector member of said first and said second connector, respectively.

14. The sensor of claim 1, further comprising a polarizer in said first and/or in said second branch between said connectors and said second beam splitter.

15. The sensor of claim 1, further comprising a polarizer in said first and/or in said second branch between said connectors and said first beam splitter.

16. The sensor of claim 1, further comprising a polarizer between said detector and said light source on the one side and said first beam splitter on the other side.

17. The sensor of claim 1, wherein the first releasable connector in the first branch and the second releasable connector in the second branch are arranged in positions such, that the sensor head is detachable from the light source and/or from the detector by disconnecting the first releasable connector and the second releasable connector.

18. The sensor of claim 1, wherein the first releasable connector in the first branch and the second releasable connector in the second branch are arranged in positions such, that a first group of components comprising the sensor head and the second beam splitter is detachable from a second group of components comprising the light source, the detector and the first beam splitter by disconnecting the first releasable connector and the second releasable connector.

19. The sensor of claim 1, comprising at least one phase modulator adapted to introduce a differential phase modulation between the interfering light waves.

20. The sensor of claim 19, further comprising a modulator module integrating said first beam splitter, said modulator and at least one polarizer for polarizing the waves propagating from said modulator module towards said second beam splitter.

21. A fiber-optic current sensor comprising
a light source generating light with a coherence length Lc,
a first beam splitter splitting the light from said light source into a first and a second branch,
a second beam splitter combining the light from said first and second branches,
a polarization-maintaining connecting fiber adapted to carry light in first and second, mutually orthogonal polarization modes and receiving light from said second beam splitter for a first passage through said connecting fiber,
a sensor head, wherein said sensor head is adapted and structured to receive light waves from said first and said second polarization mode of said connecting fiber, to generate a current-dependent phase shift between said light waves, and to reflect said light waves back into said connecting fiber with switched polarizations for a second passage through said connecting fiber,
a detector located to detect a light intensity resulting from the interference of said waves after their second passage through said connecting fiber,
a first releasable connector in said first branch,
a second releasable connector in said second branch, and
a cable assembly arranged between said connectors and said sensor head, wherein said cable assembly comprises said connecting fiber and said second beam splitter and ends in a first and a second connector member of said first and said second connector, respectively.

22. A fiber-optic current sensor comprising
a light source generating light with a coherence length Lc,
a first beam splitter splitting the light from said light source into a first and a second branch,
a second beam splitter combining the light from said first and second branches,
a polarization-maintaining connecting fiber adapted to carry light in first and second, mutually orthogonal polarization modes and receiving light from said second beam splitter for a first passage through said connecting fiber,
a sensor head, wherein said sensor head is adapted and structured to receive light waves from said first and said second polarization mode of said connecting fiber, to generate a current-dependent phase shift between said light waves, and to reflect said light waves back into said connecting fiber with switched polarizations for a second passage through said connecting fiber,
a detector located to detect a light intensity resulting from the interference of said waves after their second passage through said connecting fiber,
a first releasable connector in said first branch, and
a second releasable connector in said second branch,
wherein the first releasable connector in the first branch and the second releasable connector in the second branch are arranged in positions such, that the sensor head is detachable from the light source and/or from the detector by disconnecting the first releasable connector and the second releasable connector.

* * * * *